US011099230B2

(12) United States Patent
Li et al.

(10) Patent No.: US 11,099,230 B2
(45) Date of Patent: Aug. 24, 2021

(54) ELECTROMIGRATION TEST STRUCTURES FOR VOID LOCALIZATION

(71) Applicant: International Business Machines Corporation, Armonk, NY (US)

(72) Inventors: Baozhen Li, South Burlington, VT (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 760 days.

(21) Appl. No.: 15/827,439

(22) Filed: Nov. 30, 2017

(65) Prior Publication Data

US 2019/0162775 A1   May 30, 2019

(51) Int. Cl.
*G01R 31/28* (2006.01)
*H01L 23/522* (2006.01)
*H01L 21/3205* (2006.01)
*H01L 21/66* (2006.01)

(52) U.S. Cl.
CPC ..... *G01R 31/2858* (2013.01); *G01R 31/2853* (2013.01); *H01L 21/32051* (2013.01); *H01L 22/34* (2013.01); *H01L 23/5226* (2013.01)

(58) Field of Classification Search
CPC . G01R 31/2858; G01R 31/2853; H01L 22/34; H01L 21/32051; H01L 23/5226
See application file for complete search history.

(56) References Cited

U.S. PATENT DOCUMENTS

| 6,091,080 | A | 7/2000 | Usui |
| 6,680,484 | B1 * | 1/2004 | Young ............... H01L 22/34 257/48 |
| 6,714,037 | B1 | 3/2004 | Hau-Riege et al. |
| 6,762,597 | B1 | 7/2004 | Hau-Riege et al. |
| 6,822,437 | B1 | 11/2004 | Hau-Riege et al. |
| 6,995,392 | B2 | 2/2006 | McLaughlin et al. |
| 7,639,032 | B2 | 12/2009 | Chanda et al. |
| 7,705,352 | B2 | 4/2010 | Feustel et al. |
| 8,323,990 | B2 | 12/2012 | Shi et al. |
| 8,836,342 | B2 | 9/2014 | Hein |
| 2007/0278484 | A1 * | 12/2007 | Feustel ............... H01L 22/34 257/48 |

(Continued)

FOREIGN PATENT DOCUMENTS

CN   102655137 B   5/2015

*Primary Examiner* — Alvaro E Fortich
*Assistant Examiner* — Zannatul Ferdous
(74) *Attorney, Agent, or Firm* — Michael A. Petrocelli

(57) ABSTRACT

An electromigration (EM) test structure for localizing EM-induced voids is provided. The EM test structure includes an EM test element, a via, and a stress line. The EM test element includes a first force pad and a first sense pad. The via electrically connects the EM test element to the stress line. A second end portion of the stress line includes a second force pad and a second sense pad. The second force pad defines, at least in part, a conductive pathway between the first and second force pads. The second sense pad defines, at least in part, a conductive pathway between the first and second sense pads to facilitate four-terminal resistance measurements. A first end portion of the stress line includes a third sense pad that defines, at least in part, a conductive pathway between the first and third sense pads to facilitate four-terminal resistance measurements.

12 Claims, 5 Drawing Sheets

(56) References Cited

U.S. PATENT DOCUMENTS

| | | | |
|---|---|---|---|
| 2008/0150562 A1* | 6/2008 | Kumagai | G01R 31/2886 324/754.03 |
| 2008/0185584 A1* | 8/2008 | Walter | G01R 31/2607 257/48 |
| 2012/0136468 A1 | 5/2012 | Wang et al. | |
| 2015/0380326 A1* | 12/2015 | Chen | G01R 31/08 324/538 |
| 2017/0047287 A1* | 2/2017 | Choi | H01L 23/528 |

* cited by examiner

ELECTROMIGRATION TEST STRUCTURES FOR VOID LOCALIZATION

TECHNICAL FIELD

The present invention relates generally to the field of integrated circuit design and, more particularly, to electromigration test structures for void localization.

BACKGROUND

Electromigration (EM) is the transport of material caused by the gradual movement of metal atoms in a conductor due to the transfer of momentum between conducting electrons and the metal atoms. Electromigration-induced voids nucleate when metallic ions are dislodged from the crystal lattice of the conductor. Voids can grow, migrate, and agglomerate. Electromigration can have negative effects, such as decreasing the reliability of integrated circuits. Integrated circuits can fail due to electromigration when voids grow or agglomerate and break interconnects and/or when electromigration-induced extrusion causes a short circuit.

A typical electromigration test system passes a current through an interconnect and measures resistance as a function of time in order to detect electromigration. Voids generally nucleate at defective sites in the interconnect. Void growth and agglomeration reduces the local cross-sectional area of the interconnect over time, thereby increasing current density within the interconnect and increasing the resistance of the interconnect overt time.

SUMMARY

According to one embodiment of the present invention, an electromigration (EM) test structure for localizing EM-induced voids is provided. The EM test structure includes: an EM test element including a first force pad and a first sense pad, the EM test element forming a conductive pathway between the first force pad and the first sense pad; a via in contact with a surface of the EM test element; and a stress line having a first end portion and a second end portion, wherein: the via is in contact with a surface of the first end portion of the stress line and electrically connects the EM test element to the stress line; the second end portion of the stress line includes a second force pad and a second sense pad; the second force pad defining, at least in part, a conductive pathway between the first force pad and the second force pad and the second sense pad defining, at least in part, a conductive pathway between the first sense pad and the second sense pad; and the first end portion of the stress line includes a third sense pad defining, at least in part, a conductive pathway between the first sense pad and the third sense pad.

According to another embodiment of the present invention, a method for localizing electromigration-induced voids in an electromigration (EM) test structure is provided. The method includes: connecting one or more first force probes to a first force pad of an EM test element; connecting a first sense probe to a first sense pad of the EM test element, wherein the EM test element forms a conductive pathway between the first force pad and the first sense pad; connecting one or more second force probes to a second force pad of a stress line, wherein: a via is in contact with a surface of the EM test element and a surface of a first end portion of the stress line such that the via electrically connects the EM test element to the stress line; and a second end portion of the stress line includes the second force pad such that the second force pad defines, at least in part, a conductive pathway between the first force pad and the second force pad; connecting a second sense probe to a second sense pad of the stress line that is included in the second end portion of the stress line, the second sense pad defining, at least in part, a conductive pathway between the first sense pad and the second sense pad; and connecting a third force probe to a third sense pad of the stress line that is included in the first end portion of the stress line, the third sense pad defining, at least in part, a conductive pathway between the first sense pad and the third sense pad.

According to another embodiment of the present invention, a computer system for localizing electromigration-induced voids in an electromigration (EM) test structure is provided. The computer system includes one or more computer processors, one or more computer readable storage media, and program instructions stored on the computer readable storage media for execution by at least one of the one or more processors. The program instructions include: program instructions to send an electrical current between one or more first force probes and one or more second force probes, wherein: the one or more first force probes are connected to a first force pad of an EM test element; the one or more second force probes are connected to a second force pad of a stress line; a via is in contact with a surface of the EM test element and a surface of a first end portion of the stress line such that the via electrically connects the EM test element to the stress line; and a second end portion of the stress line includes the second force pad such that the second force pad defines, at least in part, a conductive pathway between the first force pad and the second force pad; program instructions to measure electrical resistance between a first sense probe and a second sense probe using a four-terminal sensing technique, wherein: the first sense probe is connected to a first sense pad of the EM test element, the EM test element forming a conductive pathway between the first force pad and the first sense pad; and the second sense probe is connected to a second sense pad that is included in the second end portion of the stress line, the second sense pad defining, at least in part, a conductive pathway between the first sense pad and the second sense pad; and program instructions to measure electrical resistance between the first sense probe and a third sense probe using a four-terminal sensing technique in response to determining that electrical resistance between the first sense probe and the second sense probe has increased, wherein the third sense probe is connected to a third sense pad of the stress line that is included in the first end portion of the stress line, the third sense pad defining, at least in part, a conductive pathway between the first sense pad and the third sense pad.

DETAILED DESCRIPTION

Figure 1:
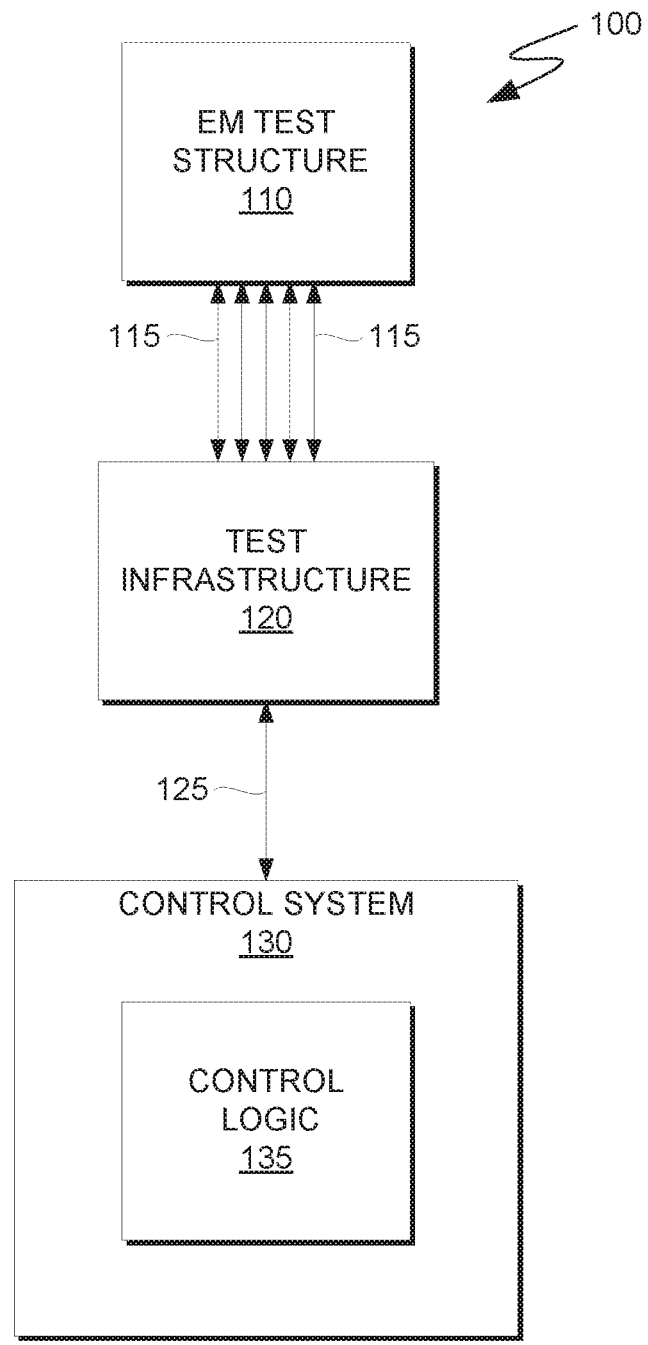
FIG. 1 is a functional block diagram depicting a computer-controlled electromigration test system, in accordance with an embodiment of the present invention.

Embodiments of the present invention recognize that electromigration is of increasing concern as integrated circuit technology advances to smaller and smaller nodes. Smaller nodes have required a transition from aluminum interconnects to copper interconnects. While copper has a lower bulk resistance and a higher EM resistance than aluminum, copper interconnects require liner materials to prevent diffusion of copper into surrounding materials and to enhance adhesion to dielectric. Liner thickness and circuit voltage, however, generally do not scale at the same rate as the transverse cross-sectional area of interconnects at each node. Consequently, current density and electromigration concerns generally increase as node size decreases. Moreover, copper interconnects generally require post-deposition processing that can induce defects in copper interconnect. For example, back end of line (BEOL) processing can include deposition and chemical-mechanical planarization steps, wherein copper is deposited on an insulator in a thick layer that overfills interconnect trenches, and a polishing pad removes the copper overburden before a capping layer of insulator is applied. The polishing step, however, can induce defects in the copper interconnect surface. Additionally, developments in three-dimensional (3D) integrated circuits have made increasing use of various forms of vias to connect different layers of metallization within 3D integrated circuit that can make electromigration testing more challenging. Formation of via channels (e.g., using reactive ion etching), plating via channels, and forming vias through dual damascene processes, for example, represent additional potential sources of defects that can nucleate into voids as a result of electromigration.

Accordingly, embodiments of the present invention recognize that determining where voids nucleate is of increasing concern to, for example, facilitate the development of new interconnect liner and cap materials, improve BEOL processes, and improve EM reliability kinetic modeling (e.g., modelling electromigration). Traditional EM test structures and test processes, however, generally utilize a physical failure analysis (PFA) following the completion of EM test protocols. In some cases, for example, localizing EM-induced voids using PFA techniques involve deprocessing a test article and preparing cross-sections of the test article for analysis by scanning electron microscope (SEM) or transmission electron microscope (TEM). Consequently, traditional EM test structures and EM test protocols can be slow and costly in monetary terms. Embodiments of the present invention, however, provide EM test structures and test protocols that facilitate detection and localization of EM-induced voids as soon as such voids reach a critical size.

Embodiments of the present invention will now be described in detail with reference to the Figures. It is to be understood that these embodiments are described only for the purpose of illustration and help those skilled in the art to understand and implement the present invention, without suggesting any limitation as to the scope of the invention. The invention described herein can be implemented in various manners other than the ones explicitly described herein.

FIG. 1 is a functional block diagram depicting a computer-controlled EM test system, in accordance with an embodiment of the present invention. More specifically, FIG. 1 depicts EM test system 100 that represents one embodiments of a computer-controlled EM test system. EM test system 100 includes EM test structure 110, test infrastructure 120, and control system 130. A plurality of leads 115 connect test infrastructure 120 to EM test structures 110. Bus 125 connects control system 130 to test infrastructure 120.

EM test structure 110 represents, at least in part, metallization layers that are analogous to those found in integrated circuits and which also include metallized elements that facilitate EM testing with respect to electromigration within the metallization layers, as subsequently described with respect to FIGS. 2A-2C.

Test infrastructure 120 represents various hardware and/or software elements that facilitate an analysis of EM test structure 110 utilizing an EM test protocol. For example, test infrastructure 120 can include one or more power supplies for supplying an electric current to EM test structure and regulating the supplied electric current in accordance with the EM test protocol. Additionally, test infrastructure 120 can include one or more electronic devices for measuring differences in electric potential and/or resistance between various points of EM test structure 110 in accordance with the EM test protocol, as described in greater detail with respect to at least FIG. 3. For example, test infrastructure 120 can include one or more voltmeters, one or more ohmmeter, one or more multimeters, and/or other devices for measuring electric potential and/or resistance known in the art. In some embodiments, test infrastructure 120 includes one or more computer-controlled switches that electrically connect a voltage or resistance measuring device to various points of EM test structure 110, thereby enabling a single voltage or resistance measuring device to obtain the various measurements described in greater detail with respect to at least FIG. 3. In other embodiments, the switch is manually operated. Test infrastructure 120 can also include heating elements, such as an oven, to enable the EM test structure 110 to be stressed at elevated temperatures. In various embodiments, elements of test infrastructure 120 can include internal and external computer hardware components, as depicted and described in further detail with respect to FIG. 4.

Leads 115 represent various forms of electrically conductive connectors that connect test infrastructure 120 to EM test structure 110 to, at least in part, supply an electric current to EM test structure 110 and measure voltages between various points of EM test structure 110 in accordance with the EM test protocol. Leads 115, for example, can incorporate elements made from copper, aluminum, silver, and/or other electrically conductive materials known in the art.

In various embodiments, control system 130 represents a computing device that can be a standalone device, a server, a laptop computer, a tablet computer, a netbook computer, a personal computer (PC), or a desktop computer. In another embodiment, control system 130 represents a computing system utilizing clustered computers and components to act as a single pool of seamless resources. In general, control system 130 can represents any computing device or a combination of devices that can communicate with test infrastructure 120 and with access to and/or capable of executing control logic 135. Control system 130 can include internal and external hardware components, as depicted and described in further detail with respect to FIG. 4. In the embodiment depicted in FIG. 1, control logic 135 is stored and executed on control system 130. In other embodiments, control logic 135 can reside and/or execute on another computing device, provided that control system 130 can access control logic 135. In yet other embodiments, control logic 135 can be stored and executed externally and accessed through a communication network, such as a local area network (LAN), a wide area network (WAN) such as the Internet, or a combination of the two, and may include wired, wireless, fiber optic or any other connection known in the art.

In general, control logic 135 operates to execute an EM test protocol that facilitates detection and localization of EM-induced voids as soon as such voids reach a critical size (i.e., voids of sufficient size to produce a measurable increase in resistance and/or an increase in resistance above a threshold value). The EM test protocol is described in greater detail with respect to at least FIG. 3. In various embodiments, control logic 135 is capable of controlling (e.g., by issuing commands through an application program interface) various elements of test infrastructure 120 (e.g., a power supply, voltage measuring device, and/or switch), as described herein. Additionally, in some embodiments, control logic 135 provides a user interface (UI) that executes locally on control system 130 and operates to provide a UI to a user of control system 130. The UI is further able to receive inputs from that user and thereby enable the user to interact with control logic 135 and/or manipulate elements of EM test system 100. The UI can also present data obtained using the EM test protocol.

Bus 125 represents a connection that enables control system 130 to communicate with test infrastructure 120. In various embodiments, bus 125 represents a local area network (LAN), a wide area network (WAN) such as the Internet, or a combination of the two, and may include wired, wireless, fiber optic or any other connection known in the art. In general, bus 125 can be any combination of connections and protocols that will support communications between control system 130 and test infrastructure 120.

Figure 2A:
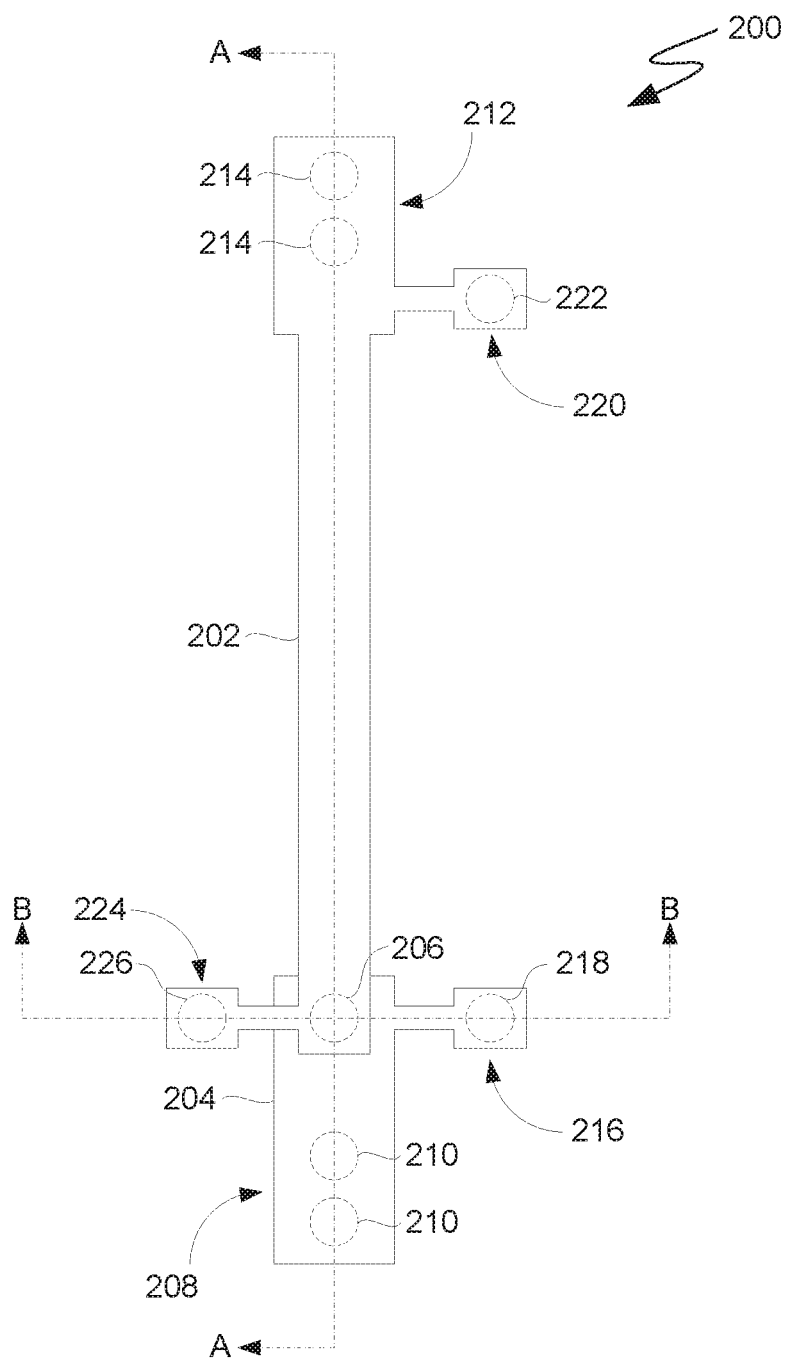
FIG. 2A is a schematic diagram of metallization layers within an electromigration test structure, in accordance with an embodiment of the present invention.
Figure 2B:
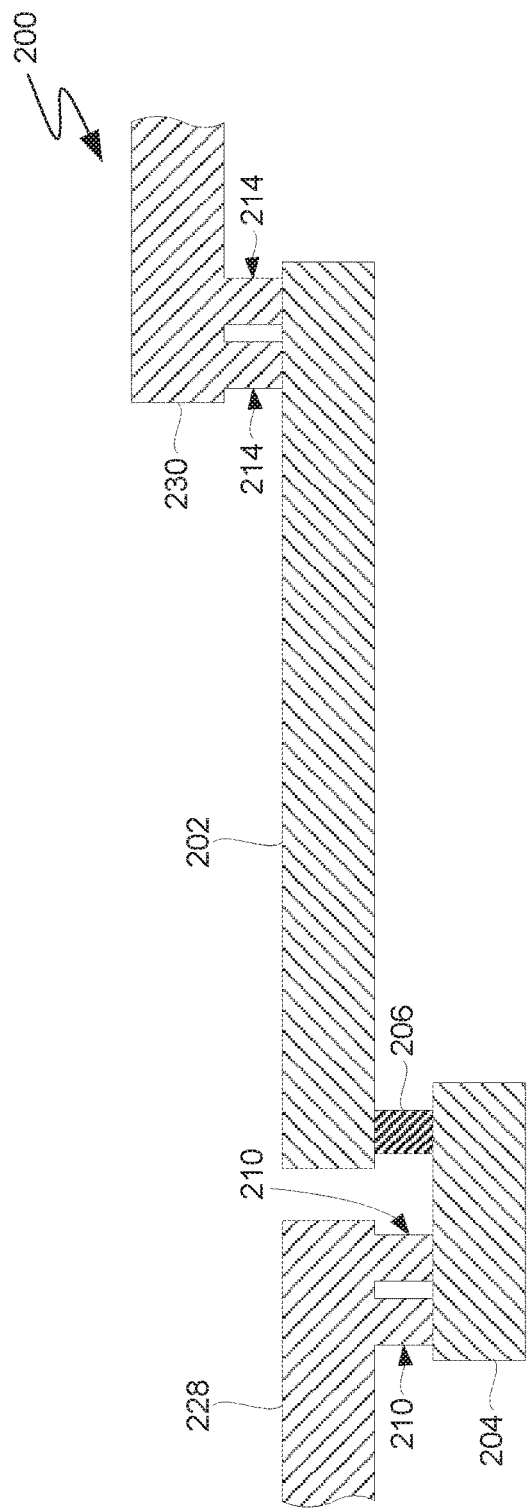
FIG. 2B is a cross-sectional view of the metallization layers of the schematic diagram depicted in FIG. 2A along a first line, in accordance with an embodiment of the present invention.
Figure 2C:
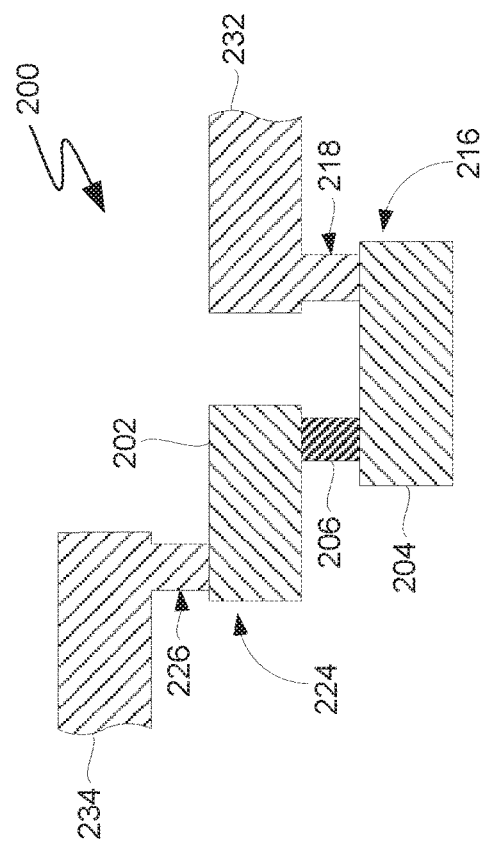
FIG. 2C is a cross-sectional view of the metallization layers of the schematic diagram depicted in FIG. 2A along a second line, in accordance with an embodiment of the present invention.

FIGS. 2A-2C depict schematic views of metallization layers within an EM test structure, in accordance with an embodiment of the present invention. For ease of illustration, FIGS. 2A-2C omit intra-layer and inter-layer dielectrics that serve to electrically insulate the metalized elements depicted in FIGS. 2A-2C. Similarly, FIGS. 2A-2C omit various liner materials, cap materials, plating materials, and other materials and elements that are commonly found in integrated circuits for ease of illustration.

FIG. 2A is a schematic diagram of metallization layers within an EM test structure, in accordance with an embodiment of the present invention. More specifically, FIG. 2A depicts a top-down schematic view of metallization layers 200. Metallization layers 200 include stress line 202, EM test element 204, and via 206. Via 206 is hidden by stress line 202 in the top-down view of metallization layers 200 depicted in FIG. 2A. Via 206 connects stress line 202 and EM test element 204 to form an electrical connection between stress line 202 and EM test element 204.

Stress line 202 and via 206 represent elements of an integrated circuit for which EM characterization is sought. For example, one or both of stress line 202 and via 206 can represent elements having a change in dimension. In another example, one or both of stress line 202 and via 206 are formed using a new BEOL process (e.g., a modified version of a dual damascene process). In yet another example, one or both of stress line 202 and via 206 are deposited in conjunction with new liner, cap, or plating materials that may affect the EM characteristics of stress line 202 and/or via 206. Persons of ordinary skill in the art will understand that many reasons for seeking EM characterization exist. Embodiments of the present invention are not to be construed as being limited to any motivation for utilizing an EM test protocol. Various other elements of metallization layers 200 described herein facilitate the detection and localization of EM-induced voids with respect to stress line 202 and via 206.

In the embodiment depicted in FIG. 2A, via 206 and EM test element 204 are located at a first end of stress line 202. FIG. 2A depicts EM test element 204 as lying below the horizontal plane of stress line 202 and connected to a bottom surface of stress line 202 by via 206. In other embodiments, EM test element 204 lies above the horizontal plane of stress line 202 and is connected to a top surface of stress line 202 by via 206. In yet other embodiments, a second instance of EM test element 204 exists at a second, opposed end of stress line 202. In such embodiments, the second instance of EM test element 204 can be coplanar with the first instance of EM test element 204 (i.e., EM test elements 204 can be symmetrical about stress line 202) or the second instance of EM test element 204 can lie in plane that is different than the one in which the first instance lies (i.e., EM test elements 204 can by asymmetrical about stress line 202).

More generally, electromigration test element 204 represents a feature of EM test structure 100 that is deposited therein to facilitate EM testing of stress line 202 and via 206. As described in greater detail with respect to FIG. 3, metallization layers 200 facilitate EM testing of stress line 202 and via 206 using, at least in part, a four-terminal sensing technique to measure electrical resistance between various points of metallization layers 200. Four-terminal sensing is advantageous in that it enables accurate measurements of electrical resistance and accurate measurements of very low resistance values. Four-terminal sensing utilizes separate pairs of current-carrying "force" electrodes and voltage-sensing "sense" electrodes. Utilizing separate pairs of force and sense electrodes approximately eliminate lead and contact resistance from measurements, which, in some cases, can be far higher than the resistance between two points of interest. In general, the force electrodes are arranged along the electrical pathway as an "outside" pair of electrodes and the sense electrodes are arranged inside of the force electrodes along the electrical pathway as an "inside" pair, and as a result, the sense electrodes do not measure voltage drops in the force electrodes or contacts. Because an essentially negligible amount of current generally flows to the measuring device via the sense electrodes, the voltage drop in the sense electrodes is similarly negligible.

To facilitate EM testing of metallization layers 200 using a four-terminal technique, EM test element 204 includes first force pad 208 and first sense pad 216. In the embodiment depicted in FIG. 2A, first sense pad 216 projects from a side surface of EM test element 204 such that it is approximately perpendicular to a longitudinal axis of EM test element 204. A longitudinal axis of first force pad 208 is approximately in line with a longitudinal axis of stress line 202 in the embodiment depicted in FIG. 2A. FIG. 2A shows, in outline form, an example of where first force probes 210 can contact first force pad 208 of EM test element 204 and an example of where first sense probe 218 can contact first sense pad 216 of EM test element 204. As stated previously, via 206 creates an electrical pathway between EM test element 204 and stress line 202. More specifically, via 206 enables an electrical current to flow from first force pad 208 of EM test element 204 to second force pad 212 of stress line 202. Second force pad 212 is located at a second end of stress line 202 (i.e., EM test element 204 and via 206 are located at the first end of stress line 202). FIG. 2A shows, in outline form, an example of where second force probes 214 can contact second force pad 212 of stress line 202. In the embodiment depicted in FIG. 2A, second sense pad 220 projects from a side surface of a second end portion of stress line 202, that also includes second force pad 212, such that second sense pad 220 is approximately perpendicular to a longitudinal axis of stress line 202. FIG. 2A shows, in outline form, an example of where second sense probe 222 can contact second sense pad 220. Persons having ordinary skill in the art will understand that this arrangement of elements, as depicted in FIG. 2A, enables a determination of the resistance between first sense pad 216 and second sense pad 220 utilizing a four-terminal technique. Similarly, the first end of stress line 202 includes third sense pad 224. In the embodiment depicted in FIG. 2A, third sense pad 224 projects from a side surface of a first end portion of stress line 202 such that third sense pad 224 is approximately perpendicular to a longitudinal axis of stress line 202. FIG. 2A shows, in outline form, an example of where third sense probe 226 can contact third sense pad 224. Persons having ordinary skill in the art will understand that this arrangement of elements, as depicted in FIG. 2A enables a determination of the resistance between first sense pad 216 and third sense pad 224 utilizing a four-terminal technique. The advantages of the arrangement of elements depicted in FIG. 2A are discussed in greater detail with respect to FIG. 3.

In the embodiment depicted in FIG. 2A, the second end portion of stress line 202 that includes second force pad 212 and from which second sense pad 220 projects is wider than other portions of stress line 202; in this and other embodiments, EM characterization within the second end portion of stress line 202 is not sought, and therefore, second end portion can be wider and/or thicker than other portions of stress line 202 in order to have increased resistance to electromigration compared to the other portions of stress line 202 (i.e., sized to have greater cross-sectional area and therefore lower current density than other portion the stress line and via). Similarly, in the embodiment depicted in FIG. 2A and other embodiments, EM characterization within EM test element 204 is not sought, and therefore, EM test element 204, including first force pad 208, can be made wider than portions of stress line 202 and via 206 to have increased resistance to electromigration (i.e., sized to have greater cross-sectional area and therefore lower current density than the stress line and via). Embodiments of the present invention, however, are not to be construed as being limited to the sizes and proportions depicted in FIGS. 2A-2C. The embodiments depicted in FIGS. 2A-2C are depicted for ease of illustration.

FIG. 2B is a cross-sectional view of the metallization layers of the schematic diagram depicted in FIG. 2A along a first line, in accordance with an embodiment of the present invention. More specifically, FIG. 2B depicts a cross-sectional view of metallization layers 200 along line A-A of FIG. 2A. FIG. 2B, however, also depicts cross-sectional schematic views of first force electrode 228 and second force electrode 230 to, at least in part, illustrate an electrical pathway between first force pad 208 and second force pad 212.

In some embodiments, first force electrode 228 acts as an anode and second force electrode 230 acts as a cathode. In other embodiments, first force electrode 228 acts as a cathode and second force electrode 230 acts as an anode. Stated differently, first force electrode 228 and second force electrode 230 can change rolls based on the polarity of the electric current supplied by test infrastructure 120, for example. In the embodiment depicted in FIG. 2B, first force probes 210 are integrated with first force electrode 228 and second force probes 214 are integrated with second force electrode 230. While first force probes 210 and second force probes 214 are not necessarily drawn to scale, it is advantageous to use wide line-connections to first force pad 208 and second force pad 212 to reduce the current density at the interface between first force electrode 228 and first force pad 208 and at the interface between second force electrode 230 and second force pad 212. Reducing the current density at these interfaces advantageously increases EM resistance at the interfaces. In some embodiments, reducing the current density at the interface and of force probes 210 and 214 may also be advantageous to reduce resistive heating. In some cases, measuring small resistance values using the four-terminal technique requires that the force electrodes carry a substantial amount of current, which can increase resistive heating and increase rates of electromigration.

In the embodiment depicted in FIG. 2B, first force electrode 228 and second force electrode 230 each utilize dual force probes to supply EM test structure 110 with an electric current. In various embodiments, current density at the interfaces with first force pad 208 and/or second force pad 212 and within first force probes 210 and/or second force probes 214 can be modified by utilizing force probes of larger or smaller diameter. The number of probes can also be increased to reduce current density at the interfaces with first force pad 208 and/or second force pad 212 and within first force probes 210 and/or second force probes 214. In other embodiments, first force electrode 228 and/or second force electrode 230 utilize a single probe that has a relatively large cross-sectional area and contact area with first force pad 208 and second force pad 212, respectively.

As stated previously, it is also advantageous to minimize electromigration within EM test element 204. Persons of ordinary skill in the art will also understand that a Blech length exists for which an interconnect having a length below the Blech length will have much higher EM resistance than an interconnect having a length above the Blech length due to the Blech effect. Interconnects having a length below the Blech length are generally characterized as being "immune" to electromigration. It is therefore advantageous that EM test element 204 be provided as a metallized element having a length between first force pad 208 and via 206 that is less than the Blech length. Similarly, it is advantageous that first sense pad 216, second sense pad 220, and third sense pad be provided as metallized elements having respective lengths below the Blech length. Electromigration resistance, however, is generally less of a concern with respect to sense pads/probes/electrodes because they generally carry only a negligible amount of current. The portions of stress line 202 for which EM characterization is sought (e.g., excluding the second end portion including second force pad 212 and second sense pad 220) and via 206, however, can have dimensions in accordance with applicable design rules such that the EM characteristics of these elements are representative of similar elements in fully-functional integrated circuits.

FIG. 2C is a cross-sectional view of the metallization layers of the schematic diagram depicted in FIG. 2A along a second line, in accordance with an embodiment of the present invention. More specifically, FIG. 2C depicts a cross-sectional view of metallization layers 200 along line B-B of FIG. 2A. FIG. 2C, however, also depicts cross-sectional schematic views of first sense electrode 232 and third sense electrode 234 to, at least in part, illustrate a four-terminal measurement between first sense pad 216 and third sense pad 224. In the embodiment depicted in FIGS. 2A-2C, a sense electrode in electrical contact with second sense pad 220 would represent a second sense electrode that would enable a four-terminal measurement between first sense pad 216 and second sense pad 220.

In the embodiment depicted in FIG. 2C, third sense probe 226 of third sense electrode 234 contacts a top surface of third sense pad 224, thereby enabling a four-terminal measurement of the resistance between first sense pad 216 and second sense pad 220, including resistance in via 206. The measurement of resistance between first sense pad 216 and third sense pad 224 therefore excludes the resistance of stress line 202 outside of the first end portion of stress line 202 (i.e., outside of the material in stress line 202 above via 206 and adjacent to third sense pad 224 that conducts current between via 206 and third sense pad 224). In other embodiments, third sense electrode 234 is disposed below third sense pad 224 such that third sense probe 226 of third sense electrode 234 contacts a bottom surface of third sense pad 224. In yet other embodiments, third sense electrode 234 can lie in the same layer of metallization layers 200 as third sense pad 224.

Figure 3:
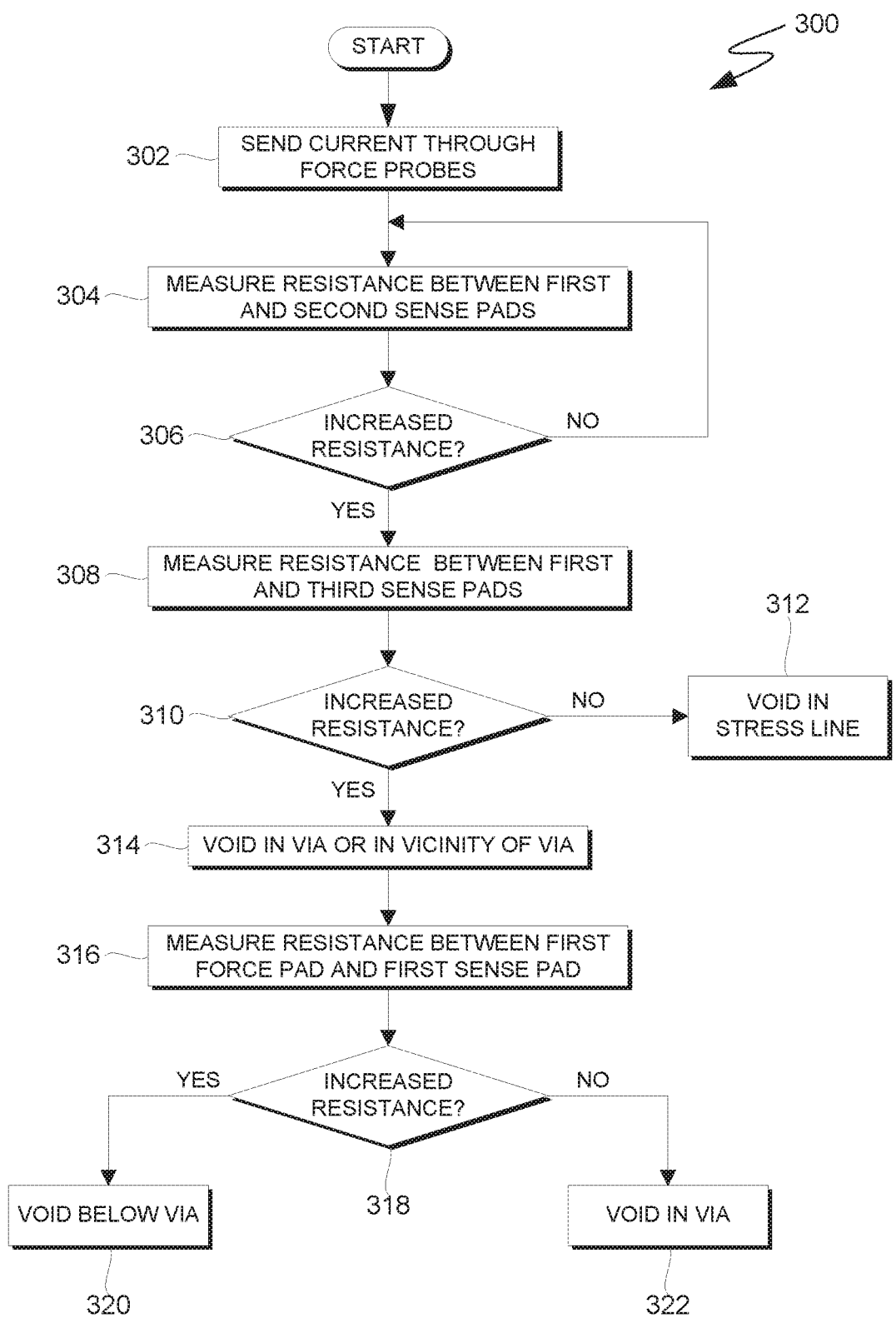
FIG. 3 is a flowchart depicting operations of an electromigration test protocol for detecting and localizing electromigration-induced voids, in accordance with an embodiment of the present invention.

FIG. 3 is a flowchart depicting operations of an electromigration test protocol for detecting and localizing electromigration-induced voids, in accordance with an embodiment of the present invention. More specifically, FIG. 3 depicts test protocol 300 of control logic 135 executing on control system 130 within EM test system 100. While test protocol 300 is discussed herein with respect to the embodiment of EM test structure 110 depicted in FIGS. 2A-2C, embodiments of test protocol 300 are not to be construed as being limited to the embodiment of EM test structure 110 depicted in FIGS. 2A-2C. Additionally test protocol 300 is discussed with respect to an embodiment in which first force pad 208 represents a cathode and second force pad 212 represents an anode, but embodiments of test protocol 300 are not to be construed as being limited thereto.

To induce electromigration in EM test structure 110, test protocol 300 sends a current between first force pad 208 and second force pad 212 using first force probes 210 of first force electrode 228 (i.e., a cathode) and second force probes 214 of second force electrode 230 (i.e., an anode; operation 302). The amount of current supplied can vary between embodiments of the present inventions. Persons of ordinary skill in the art will understand that higher currents will generally result in the formation of EM-induced voids more quickly than lower currents. Providing a high current may advantageously reduce the time to complete test protocol 300.

To detect the formation of EM-induced voids in EM test structure 110, test protocol 300 measures resistance between first sense pad 216 and second sense pad 220 using a four-terminal technique as discussed herein (operation 304). This measurement is advantageous in that changes in the resistance between first sense pad 216 and second sense pad 220 can indicate the nucleation of EM-induced voids in stress line 202, in via 206, and in the vicinity of via 206. In other embodiments, test protocol 300 measures the resistance between first force pad 208 and second force pad 212 using first force probes 210 of first force electrode 228 and second force probes 214 of second force electrode 230 (operation 304). While it is advantageous in terms of measurement accuracy to use a four-terminal technique, using a two-terminal or three-terminal technique to measure resistance in stress line 202 and via 206 can simplify the design of EM test structure 110 by eliminating second sense pad 216 and eliminating structures to enable second sense probe 222 and a corresponding second sense electrode to access second sense pad 220. The measurement of resistance between first sense pad 216 and second sense pad 220 can be a continuous measurement over a period of time or represent an intermittent measurement at defined time intervals. Additionally, measurement(s) of resistance between first sense pad 216 and second sense pad 220 can begin at approximately the same time as providing the electrical current to EM test structure 110 or after a predefined amount of time.

After each resistance measurement or at predetermined time intervals, test protocol 300 determines whether or not resistance has increased between first sense pad 216 and second sense pad 220 (decision 306). In some embodiments, test protocol 300 registers an increase in resistance between first sense pad 216 and second sense pad 220 when an increase resistance exceeds a first threshold value (e.g., the minimum measurable increase in resistance, a resistance associated with a particular void size, or a resistance associated with a particular increase in void size). The increase in resistance can represent an increase between consecutively measured resistance values and/or any two measured resistance values. If test protocol 300 determines that resistance has not increased between first sense pad 216 and second sense pad 220 (decision 306, NO branch), test protocol continues to measure resistance between first sense pad 216 and second sense pad 220 (operation 304). If test protocol 300 registers an increase in resistance between first sense pad 216 and second sense pad 220 (decision 306, YES branch), test protocol 300 begins to measure resistance between first sense pad 216 and third sense pad 224 (operation 308).

Like the measurement(s) of resistance between first sense pad 216 and second sense pad 220 (operation 304), measurement(s) of resistance between first sense pad 216 and third sense pad 224 are made using a four-terminal technique. This measurement is advantageous in that changes in the resistance between first sense pad 216 and third sense pad 224 can indicate the nucleation of EM-induced voids in via 206 and in the vicinity of via 206 while disregarding the effects of EM-induced voids in stress line 202. The measurement of resistance between first sense pad 216 and third sense pad 224 can be a continuous measurement over a period of time or represent an intermittent measurement at defined time intervals. Additionally, measurement(s) of resistance between first sense pad 216 and third sense pad 214 can begin at approximately the same time as registering an increase in resistance between first sense pad 216 and second sense pad 220 or after a predefined amount of time.

After each resistance measurement or at predetermined time intervals, test protocol 300 determines whether or not resistance has increased between first sense pad 216 and third sense pad 224 (decision 310). In some embodiments, test protocol 300 registers an increase in resistance between first sense pad 216 and third sense pad 224 when an increase resistance exceeds a second threshold value. In some embodiments, the first and second threshold values are equal (i.e., the threshold values used for decision 306 and decision 310 are the same). The increase in resistance can represent an increase between consecutively measured resistance values and/or any two measured resistance values. If test protocol 300 determines that resistance has not increased between first sense pad 216 and third sense pad 224 (decision 310, NO branch), test protocol 300 determines that a void exists in stress line 202 (operation 312). If test protocol 300 registers an increase in resistance between first sense pad 216 and third sense pad 224 (decision 310, YES branch), test protocol 300 determines that a void exists within via 206 or within the vicinity of via 206 (operation 314), and test protocol 300 begins to measure resistance between first force pad 208 and first sense pad 216 (operation 316).

Unlike the measurement of resistance between first sense pad 216 and second sense pad 220 (operation 304) and the measurement of resistance between first sense pad 216 and third sense pad 224 (operation 308), the measurement of resistance between first force pad 208 and first sense pad 216 (operation 316) is not a four-terminal measurement in the embodiment depicted in FIGS. 2A-2C. While utilizing first force electrode 228 and first force probes 210 to both supply the electrical current (operation 302) and measure the resistance between first force pad 208 and first sense pad 216 (operation 316) reduces the accuracy of the measurement by including voltage drops in first force electrode 228 and first force probes 210, the design of EM test structure 110 is advantageously simplified versus an EM test structure designed with an additional sense pad to make this measurement using a four-terminal technique. Embodiments of the present invention, however, are not to be construed as precluding the use of a four-terminal technique and any modifications to the embodiment of EM test structure 110 depicted in FIGS. 2A-2C necessary to measure the resistance of EM test element 204 in the vicinity of via 206 using a four-terminal technique. The measurement of resistance between first force pad 208 and first sense pad 216 can be a continuous measurement over a period of time or represent an intermittent measurement at defined time intervals. Additionally, measurement(s) of resistance between first force pad 208 and first sense pad 216 can begin at approximately the same time as registering an increase in resistance between first sense pad 216 and third sense pad 224 or after a predefined amount of time.

After each resistance measurement or at predetermined time intervals, test protocol 300 determines whether or not resistance has increased between first force pad 208 and first sense pad 216 (decision 318). In some embodiments, test protocol 300 registers an increase in resistance between first sense pad 216 and third sense pad 224 when an increase resistance exceeds a third threshold value. In some embodiments, the third threshold value is equal to one or both of the first and second threshold values (i.e., the threshold value used for decision 318 is the same as the value used for decision 306 and/or decision 310). The increase in resistance can represent an increase between consecutively measured resistance values and/or any two measured resistance values. If test protocol 300 registers an increase in resistance between first force pad 208 and first sense pad 216 (decision 318, YES branch), test protocol 300 determines that a void exists below via 206 (operation 320). If, on the other hand, test protocol 300 determines that resistance has not increased between first force pad 208 and first sense pad 216 (decision 318, NO branch), test protocol 300 determines that a void exists in via 206 (operation 322).

Figure 4:
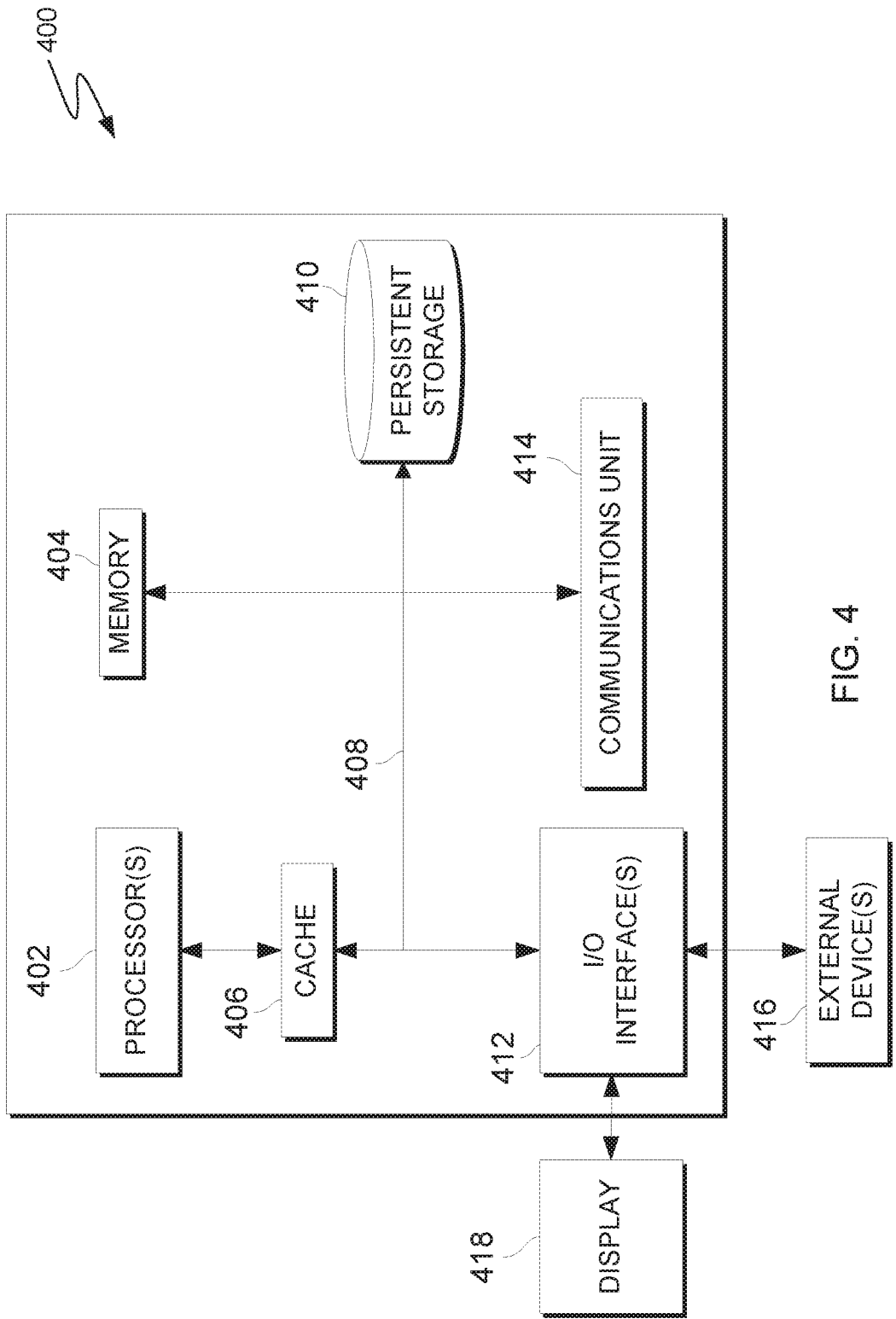
FIG. 4 is a block diagram of components of a computing device executing operations for detecting and localizing electromigration-induced voids, in accordance with an embodiment of the present invention.

FIG. 4 is a block diagram of components of a computing device executing operations for detecting and localizing electromigration-induced voids, in accordance with an embodiment of the present invention. In one embodiment, computing system 400 is representative of control system 130 executing control logic 135 within EM test system 100.

It should be appreciated that FIG. 4 provides only an illustration of one implementation and does not imply any limitations with regard to the environments in which different embodiments may be implemented. Many modifications to the depicted environment may be made.

Computing system 400 includes processor(s) 402, cache 406, memory 404, persistent storage 410, input/output (I/O) interface(s) 412, communications unit 414, and communications fabric 408. Communications fabric 408 provides communications between cache 406, memory 404, persistent storage 410, communications unit 414, and input/output (I/O) interface(s) 412. Communications fabric 408 can be implemented with any architecture designed for passing data and/or control information between processors (such as microprocessors, communications and network processors, etc.), system memory, peripheral devices, and any other hardware components within a system. For example, communications fabric 408 can be implemented with one or more buses or a crossbar switch.

Memory 404 and persistent storage 410 are computer readable storage media. In this embodiment, memory 404 includes random access memory (RAM). In general, memory 404 can include any suitable volatile or non-volatile computer readable storage media. Cache 406 is a fast memory that enhances the performance of processor(s) 402 by holding recently accessed data, and data near recently accessed data, from memory 404.

Program instructions and data used to practice embodiments of the present invention may be stored in persistent storage 410 and in memory 404 for execution by one or more of the respective processor(s) 402 via cache 406. In an embodiment, persistent storage 410 includes a magnetic hard disk drive. Alternatively, or in addition to a magnetic hard disk drive, persistent storage 410 can include a solid state hard drive, a semiconductor storage device, read-only memory (ROM), erasable programmable read-only memory (EPROM), flash memory, or any other computer readable storage media that is capable of storing program instructions or digital information.

The media used by persistent storage 410 may also be removable. For example, a removable hard drive may be used for persistent storage 410. Other examples include optical and magnetic disks, thumb drives, and smart cards that are inserted into a drive for transfer onto another computer readable storage medium that is also part of persistent storage 410.

Communications unit 414, in these examples, provides for communications with other data processing systems or devices. In these examples, communications unit 414 includes one or more network interface cards. Communications unit 414 may provide communications through the use of either or both physical and wireless communications links. Program instructions and data used to practice embodiments of the present invention may be downloaded to persistent storage 410 through communications unit 414.

I/O interface(s) 412 allows for input and output of data with other devices that may be connected to computer system 400. For example, I/O interface(s) 412 may provide a connection to external device(s) 416 such as a keyboard, keypad, a touch screen, and/or some other suitable input device. External device(s) 416 can also include portable computer readable storage media such as, for example, thumb drives, portable optical or magnetic disks, and memory cards. Software and data used to practice embodiments of the present invention can be stored on such portable computer readable storage media and can be loaded onto persistent storage 410 via I/O interface(s) 412. I/O interface(s) 412 also connect to display 418.

Display 418 provides a mechanism to display or present data to a user and may be, for example, a computer monitor.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed approximately concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

As used herein, a list of alternatives such as "at least one of A, B, and C" should be interpreted to mean "at least one A, at least one B, at least one C, or any combination of A, B, and C."

Additionally, the phrase "based on" should be interpreted to mean "based, at least in part, on."

The term "exemplary" means of or relating to an example and should not be construed to indicate that any particular embodiment is preferred relative to any other embodiment.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A method for localizing electromigration-induced voids in an electromigration (EM) test structure, the method comprising,
    connecting one or more first force probes to a first force pad of an EM test element;
    connecting a first sense probe to a first sense pad of the EM test element, the EM test element forming a conductive pathway between the first force pad and the first sense pad;
    connecting one or more second force probes to a second force pad of a stress line, wherein:
        a via is in contact with at least one of a bottom surface of a first end portion of the stress line and a top surface of the EM test element such that the EM test element lies below a horizontal plane of the stress line, and a top surface of the first end portion of the stress line and a bottom surface of the EM test element such that the EM test element lies above a horizontal plane of the stress line, the via electrically connecting the EM test element to the stress line, a length of the EM test element between the first force pad and a portion of the EM test element in contact with the via being less than a Blech length for minimizing electromigration within the EM test element and a longitudinal axis of the first force pad of the EM test element being in line with a longitudinal axis of the stress line; and
        a second end portion of the stress line including the second force pad such that the second force pad defines, at least in part, a conductive pathway between the first force pad and the second force pad;
    connecting a second sense probe to a second sense pad of the stress line that is included in the second end portion of the stress line, the second sense pad defining, at least in part, a conductive pathway between the first sense pad and the second sense pad; and
    connecting a third force probe to a third sense pad of the stress line that is included in the first end portion of the stress line, the third sense pad defining, at least in part, a conductive pathway between the first sense pad and the third sense pad.

2. The method of claim 1, further comprising:
    sending an electrical current between the one or more first force probes and the one or more second force probes;
    measuring an electrical resistance between the first sense probe and the second sense probe using a four-terminal sensing technique; and
    in response to determining that the electrical resistance between the first sense probe and the second sense probe has increased, measuring an electrical resistance between the first sense probe and the third sense probe using the four-terminal sensing technique.

3. The method of claim 2, further comprising:
    in response to determining that the electrical resistance between the first sense probe and the third sense probe has not increased, determine that a void exists in the stress line.

4. The method of claim 2, further comprising:
    in response to determining that the electrical resistance between the first sense probe and the third sense probe has increased, measuring an electrical resistance between the one or more first force probes and the first sense probe to determine whether a void exists within at least one of the via and a vicinity of the via.

5. The method of claim 4, further comprising:
    in response to determining that the electrical resistance between the one or more first force probes and the first sense probe has increased, determining that the void exists between the via and the EM test element.

6. The method of claim 4, further comprising:
    in response to determining that the electrical resistance between the one or more first force probes and the first sense probe has not increased, determining that the void exists within the via.

7. The method of claim 2, wherein the one or more first force probes are a cathode and the one or more second force probes are an anode.

8. The method of claim 2, wherein the one or more first force probes are an anode and the one or more second force probes are a cathode.

9. A computer system for localizing electromigration-induced voids in an electromigration (EM) test structure, the computer system comprising:
    one or more computer processors;
    one or more computer readable storage media;
    program instructions stored on the one or more computer readable storage media for execution by at least one of the one or more processors, the program instructions comprising:
    program instructions to send an electrical current between one or more first force probes and one or more second force probes, wherein:
        the one or more first force probes are connected to a first force pad of an EM test element;
        the one or more second force probes are connected to a second force pad of a stress line;
        a via is in contact with at least one of a bottom surface of a first end portion of the stress line and a top surface of the EM test element such that the EM test element lies below a horizontal plane of the stress line, and a top surface of the first end portion of the stress line and a bottom surface of the EM test element such that the EM test element lies above a horizontal plane of the stress line, the via electrically connecting the EM test element to the stress line, a length of the EM test element between the first force pad and a portion of the EM test element in contact with the via being less than a Blech length for minimizing electromigration within the EM test element and a longitudinal axis of the first force pad of the EM test element being in line with a longitudinal axis of the stress line; and a second end portion of the stress line includes the second force pad such that the second force pad defines, at least in part, a conductive pathway between the first force pad and the second force pad;

program instructions to measure an electrical resistance between a first sense probe and a second sense probe using a four-terminal sensing technique, wherein:

the first sense probe is connected to a first sense pad of the EM test element, the EM test element forming a conductive pathway between the first force pad and the first sense pad; and the second sense probe is connected to a second sense pad that is included in the second end portion of the stress line, the second sense pad defining, at least in part, a conductive pathway between the first sense pad and the second sense pad; and program instructions to measure an electrical resistance between the first sense probe and a third sense probe using a four-terminal sensing technique in response to determining that the electrical resistance between the first sense probe and the second sense probe has increased, wherein the third sense probe is connected to a third sense pad of the stress line that is included in the first end portion of the stress line, the third sense pad defining, at least in part, a conductive pathway between the first sense pad and the third sense pad.

10. The computer system of claim 9, the program instructions further comprising:

program instructions to determine that a void exists in the stress line in response to determining that the electrical resistance between the first sense probe and the third sense probe has not increased; and program instructions to measure an electrical resistance between the one or more first force probes and the first sense probe to determine whether the void exists within at least one of the via and a vicinity of the via in response to determining that the electrical resistance between the first sense probe and the third sense probe has increased.

11. The computer system of claim 10, further comprising:

program instructions to determine that the void exists between the via and the EM test element in response to determining that the electrical resistance between the one or more first force probes and the first sense probe has increased; and program instructions to determine that the void exists within the via in response to determining that the electrical resistance between the one or more first force probes and the first sense probe has not increased.

12. The computer system of claim 9, further comprising:

program instructions to utilize the one or more first force probes as a cathode and the one or more second force probes as anode; and program instructions to utilize the one or more first force probes as the anode and the one or more second force probes as the cathode.

\* \* \* \* \*